(12) United States Patent
Doorenbos et al.

(10) Patent No.: US 7,380,185 B2
(45) Date of Patent: May 27, 2008

(54) REDUCED PIN COUNT SCAN CHAIN IMPLEMENTATION

(75) Inventors: Jerry L. Doorenbos, Tucson, AZ (US);
Dimitar Trifonov, Tucson, AZ (US);
Marco A. Gardner, Tuscon, AZ (US)

(73) Assignee: Texas Instruments Incorporated, Dallas, TX (US)

( * ) Notice: Subject to any disclaimer, the term of this patent is extended or adjusted under 35 U.S.C. 154(b) by 165 days.

(21) Appl. No.: 11/311,833

(22) Filed: Dec. 19, 2005

(65) Prior Publication Data
US 2007/0143653 A1    Jun. 21, 2007

(51) Int. Cl.
*G01R 31/28* (2006.01)
(52) U.S. Cl. ..................................... 714/726
(58) Field of Classification Search ................. 714/726
See application file for complete search history.

(56) References Cited

U.S. PATENT DOCUMENTS 5,513,186 A * 4/1996 Levitt ........................ 714/727
5,734,660 A * 3/1998 Fujisaki ..................... 714/726
5,812,561 A * 9/1998 Giles et al. ................. 714/726
6,125,464 A * 9/2000 Jin ............................ 714/727
7,219,281 B2 * 5/2007 Dubey ....................... 714/727
7,219,282 B2 * 5/2007 Sunter et al. ............... 714/727
2003/0041296 A1 * 2/2003 Bos et al. ................... 714/729
2006/0248419 A1 * 11/2006 Colunga et al. ............ 714/727

* cited by examiner

*Primary Examiner*—James C Kerveros
(74) *Attorney, Agent, or Firm*—Alan K. Stewart; W. James Brady; Frederick J. Telecky, Jr.

(57) ABSTRACT

The synchronous logic device with reduced pin count scan chain includes: more than two flip/flops coupled to form a shift register for receiving a scan data input signal; a combinational logic circuit for receiving device inputs, generating flip/flop inputs for the more than two flip/flops, and generating an output signal; a first multiplexer for providing a clock signal to the more than two flip/flops during a test mode; a second multiplexer for selecting between a test mode output from the shift register and the output signal from the combinational logic circuit, and for providing a scan data output signal; and wherein the scan data input signal and the scan data output signal share an input/output pin.

9 Claims, 6 Drawing Sheets

REDUCED PIN COUNT SCAN CHAIN IMPLEMENTATION

FIELD OF THE INVENTION

The present invention relates to electronic circuitry and, in particular, to a reduced pin count scan chain implementation.

BACKGROUND OF THE INVENTION

Logic designs frequently use scan chains to enhance testability and test coverage. Typical scan chain implementations utilize four signals (Scan Data In, Scan Data Out, Scan Clock, and Scan Enable) connected to four pins. However, some small pin count packages do not have enough available pins even with a special test mode configuration.

Shown in FIG. 1 is a prior art general synchronous logic design implementation without the addition of a scan chain to facilitate testing. Pins A1, A2, and A3 are inputs, and pin A4 is an output. Pin SysClk provides the clock signal to node CLK of the flip/flops. Three flip/flops DTC0, DTC1, and DTC2 receive a common clock signal. They each receive one of the data input signals D1, D2, and D3 from the Combinational Logic circuit 20. The flip/flops DTC0, DTC1, and DTC2 have output signals Q1, Q2, and Q3 which are inputs to the Combinational Logic circuit 20. The Combinational Logic circuit 20 represents the combinational logic that generates the flip/flop inputs D1-D3 from the input signals A1-A3 and the flip/flop outputs Q1-Q3. The Combinational Logic circuit 20 also generates the output at pin A4 from input signals A1-A3 and the flip/flop outputs Q1-Q3. The number of input pins, the number of output pins, and the number of flip/flops can be significantly larger, but the circuit of FIG. 1 is sufficient to describe the operation of the device.

Shown in FIG. 2 is a prior art synchronous logic design implementation that includes a scan chain to facilitate testing by making the internal circuit nodes (the inputs and outputs of the combinational logic circuit) more controllable and more observable. This circuit is very similar to the circuit of FIG. 1 in that the Combinational Logic circuit 20 is the same and the circuit has the same number of flip/flops SDC0, SDC1, and SDC2. The flip/flops have been changed to scannable flip/flips which have an input selection multiplexer controlled by input node S to select between the normal mode input D (D1, D2, and D3) when the signal at node S is logic 0, and the scan mode input node SD when the signal at node S is logic 1. The signal at node S is determined by combining signal TestMode and signal ScanEnable at AND gate AND10. Multiplexer MUX10 is added to the circuit to select one of the input pins A3 (ScanClock) for the clock CLK to the flip/flops during the test mode of operation if the clock is not already from an external pin. Multiplexer MUX12 is added to select between the Q output Q3 of the last flip/flop SDC2 in the scan chain and the normal mode output Y4 (from the Combinational Logic 20 which could be the direct output of a flip/flop). And gate AND10 is added to ensure that the S inputs to the flip/flops are all set to logic 0 when the device is not in test mode of operation. This technique is called a scan chain because the flip/flops in the design are connected in a long chain to form a shift register in which data is input on a pin to the input of the first flip/flop. The output of the first flip/flop is connected to the input of the second flip/flop and so on until the output of the last flip/flop is connected to an output pin. This path allows the external testing circuitry to load the flip/flops in the design with any desired pattern by shifting in a set of data through the shift register. When the signal TestMode is logic 0, the logic performs it normal logic function. When the signal TestMode is logic 1, the logic circuit is configured for scan chain testing. During test mode, when the signal ScanEnable is set to logic 1 (node A1 in this example) the internal flip/flops are configured as a shift register with the input to the shift register from node A2 (ScanDataIn) and the output on node A4 (ScanDataOut). Pin A3 provides the clock (ScanClock) for the shift register. A complete set of data is shifted into the shift register (3 bits in this case). After this data is shifted in, the signal ScanEnable is set to logic 0 so that on the next active edge of signal ScanClock, the flip/flops latch data from the D inputs which come from the combinational logic circuit 20. Since the inputs to the combinational logic circuit 20 are able to be controlled by the data shifted into the flip/flops when signal ScanEnable=1, the inputs to the combinational logic circuit 20 are highly controllable. With signal ScanEnable=0, the flip/flops latch the output of the combinational logic circuit 20. By activating signal ScanClock only once while signal ScanEnable=0, the flip/flops will latch data from controlled inputs to the combinational logic circuit 20. By making signal ScanEnable=1, the data in the flip/flops can be shifted out on pin A4 (which can be simultaneous to shifting in the next set of input data). Monitoring the output data of the scan chain allows the data latched by the scan chain when signal ScanEnable=0 to be checked and this makes the design highly observable. This basic scan chain operation requires a minimum of 4 pins once the logic is enabled in test mode for signals ScanEnable, ScanDataIn, ScanDataOut, and ScanClock.

SUMMARY OF THE INVENTION

A synchronous logic device with reduced pin count scan chain includes: more than two flip/flops coupled to form a shift register for receiving a scan data input signal; a combinational logic circuit for receiving device inputs, generating flip/flop inputs for the more than two flip/flops, and generating an output signal; a first multiplexer for providing a clock signal to the more than two flip/flops during a test mode; a second multiplexer for selecting between a test mode output from the shift register and the output signal from the combinational logic circuit, and for providing a scan data output signal; and wherein the scan data input signal and the scan data output signal share an input/output pin.

DETAILED DESCRIPTION OF PREFERRED EMBODIMENTS

Figure 1:
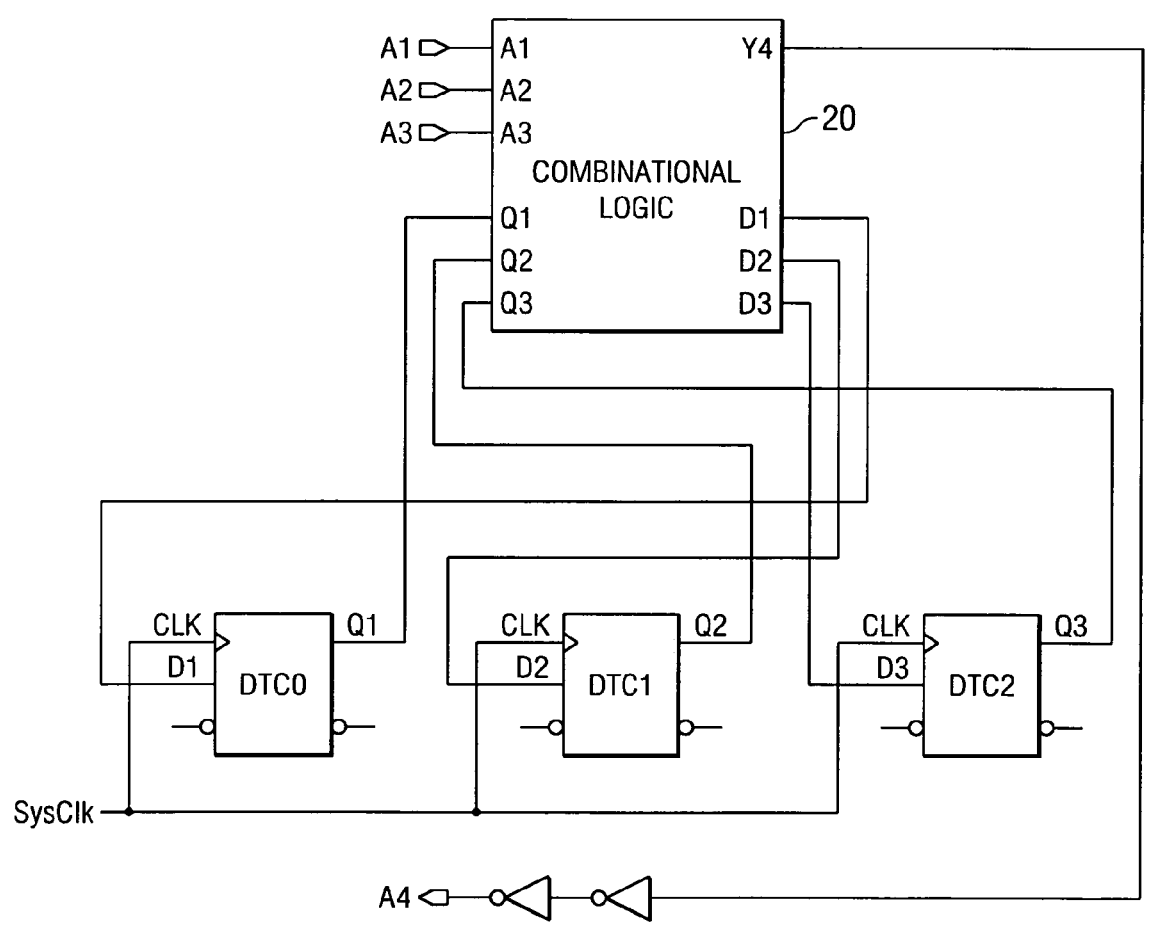
FIG. 1 is a circuit diagram of a prior art general synchronous logic design implementation without the addition of a scan chain to facilitate testing.
Figure 2:
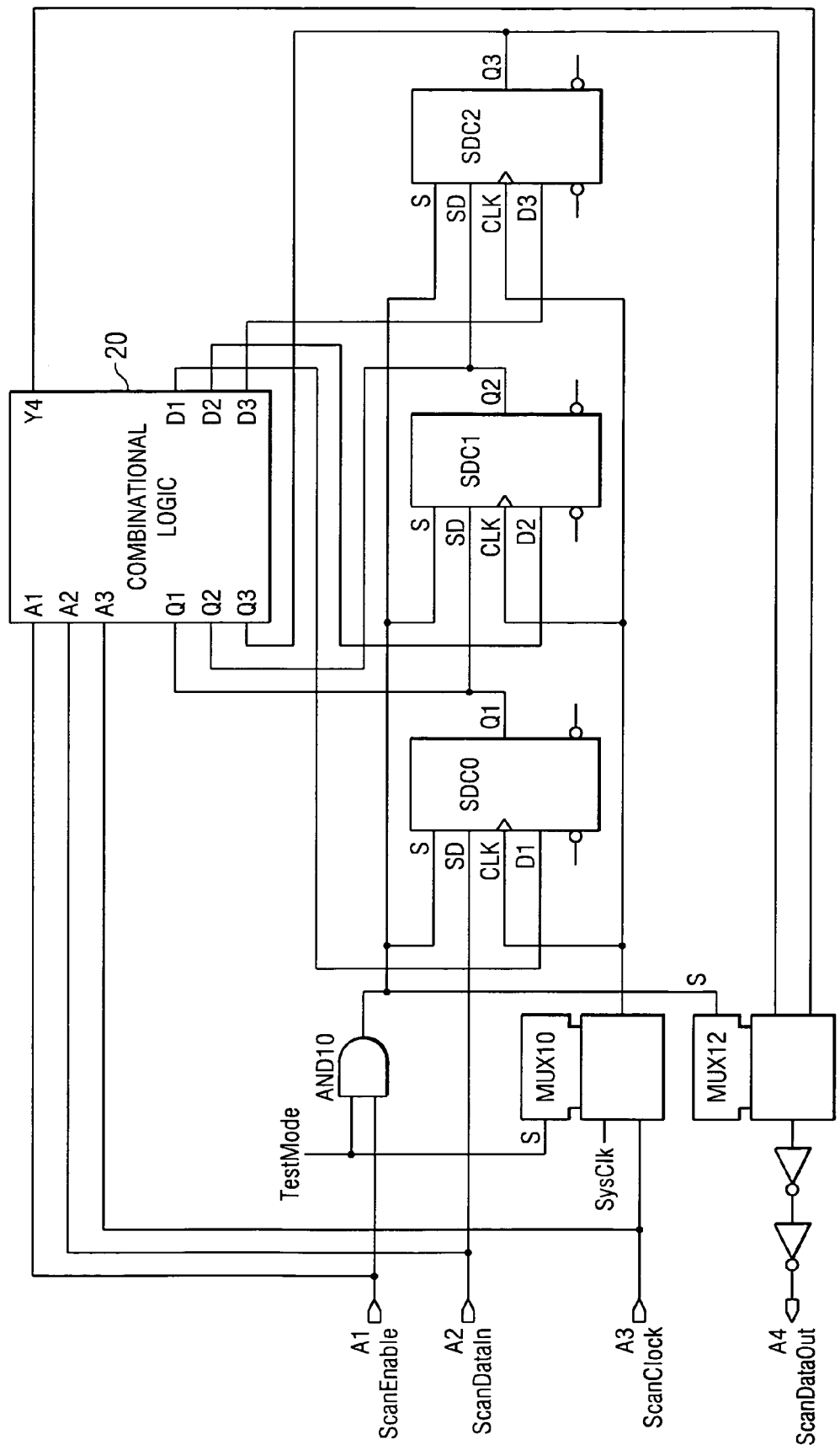
FIG. 2 is a circuit diagram of a prior art synchronous logic design implementation that includes a scan chain to facilitate testing.
Figure 3:
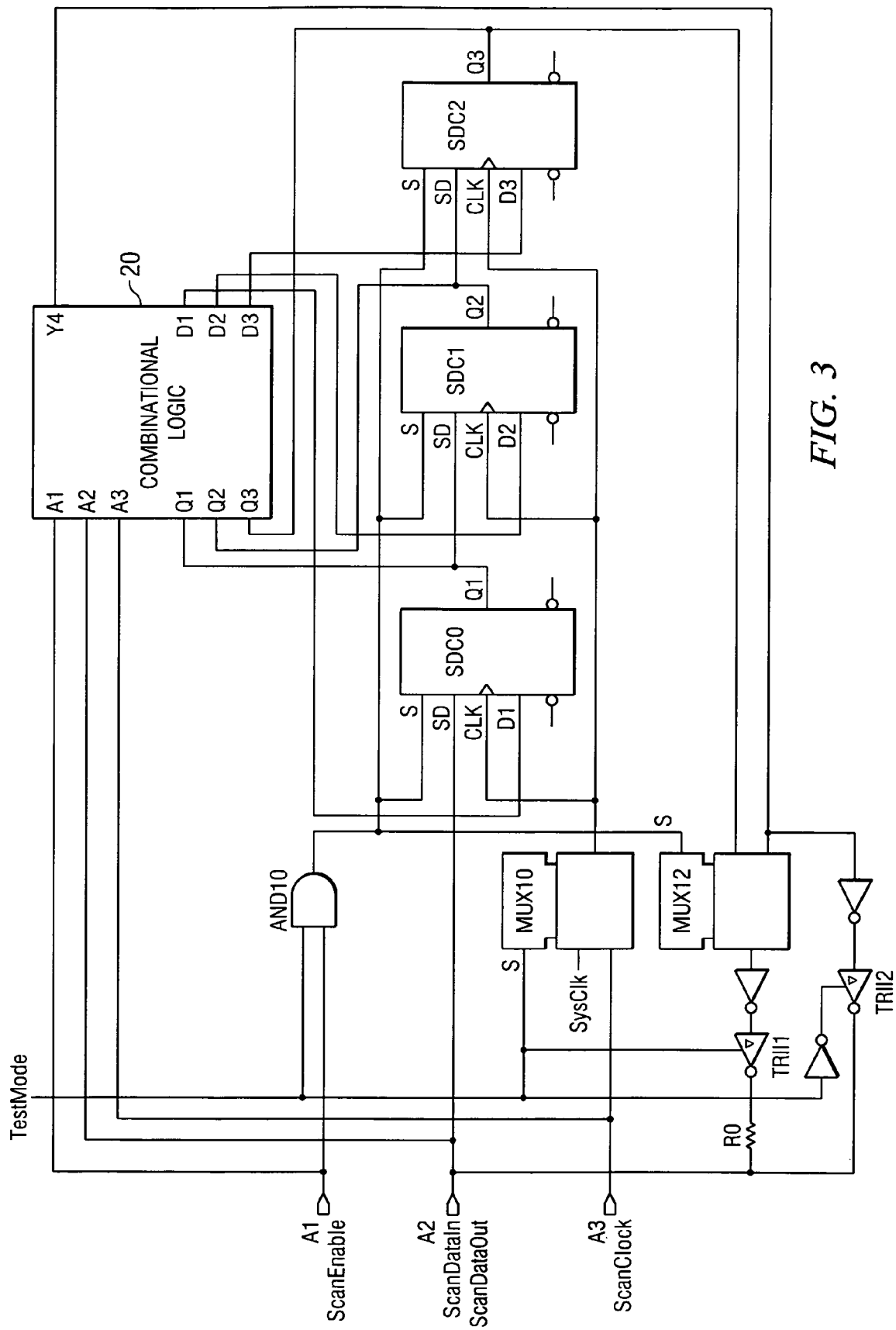
FIG. 3 is a circuit diagram of a first preferred embodiment scan chain implemented using three pins by combining signals ScanDataIn and ScanDataOut on the same pin.

A scan chain can be implemented using three pins or even two pins by adding additional circuitry to allow the necessary scan chain signals to be encoded and decoded from less than four signals. A first preferred embodiment reduced pin count scan chain implementation, shown in FIG. 3, is a scan chain implemented using three pins by combining signals ScanDataIn and ScanDataOut on the same pin. This is accomplished by using a weak output driver (one that can be easily overdriven by the external test circuitry) depicted by driver TRII1 and resistor R0 instead of the typical strong driver TRII2. Except for the added weak driver (which could be a weakened version of the strong driver) and associated control signals to activate it during test mode instead of the strong driver, the rest of the circuit is the same as the traditional scan chain circuit shown in FIG. 2. The key to operation of this circuit is that the test circuitry must overdrive pin A2 (ScanDataIn, ScanDataOut) to the desired state for the active edge of signal ScanClock (rising edge in this example) to provide the correct data to the input SD of the first flip/flop SDC0. The test circuitry should allow the weak driver on the chip to control the state of pin A2 at some other time (part of the duration of signal ScanClock=0 in this example) so that the test circuitry can read the output of the last flip/flop SDC2 while signal ScanEnable=1. While signal ScanEnable=0, over-driving at the appropriate time allows for pin A2 to provide input to the Combinational Logic circuit 20, and not over-driving at the appropriate time allows the output at node Y4 to be observed.

Figure 4:
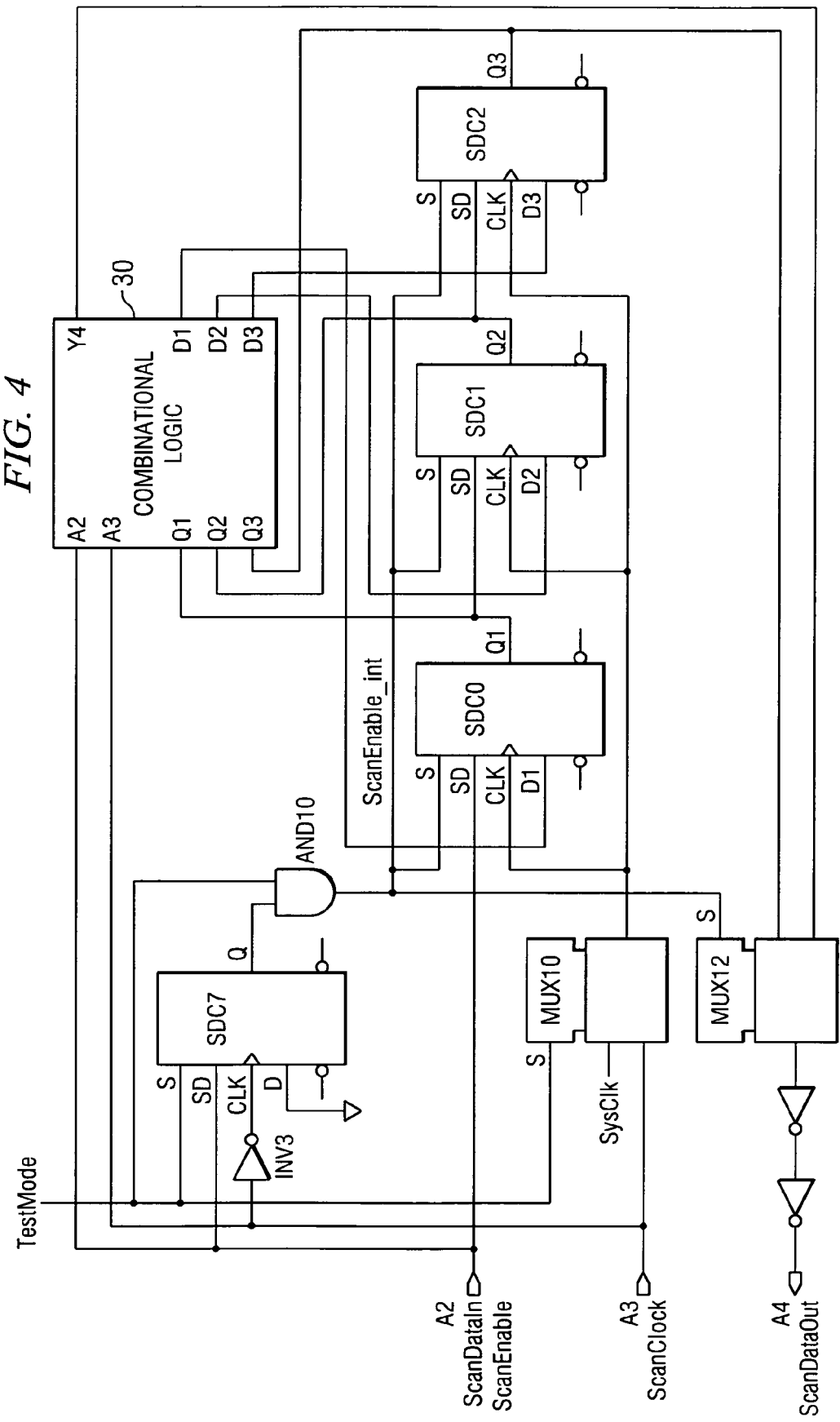
FIG. 4 is a circuit diagram of a second preferred embodiment scan chain implemented using three pins by combining signals ScanDataIn and ScanEnable on the same pin.

A second preferred embodiment reduced pin count scan chain implementation, shown in FIG. 4, is another way that a scan chain may be implemented using three pins, this time by combining signals ScanDataIn and ScanEnable on the same pin A2. This circuit is similar to the traditional scan chain, shown in FIG. 2, with the addition of the inverter INV3 for signal ScanClock and the flip/flop SDC7 to generate the control for signal ScanEnable_int. This circuit provides input to the scan chain shift register or combinational logic 30 during one edge of signal ScanClock (rising edge in this example) and the next state of signal ScanEnable_int on the other edge (falling edge in this example.)

Figure 5:
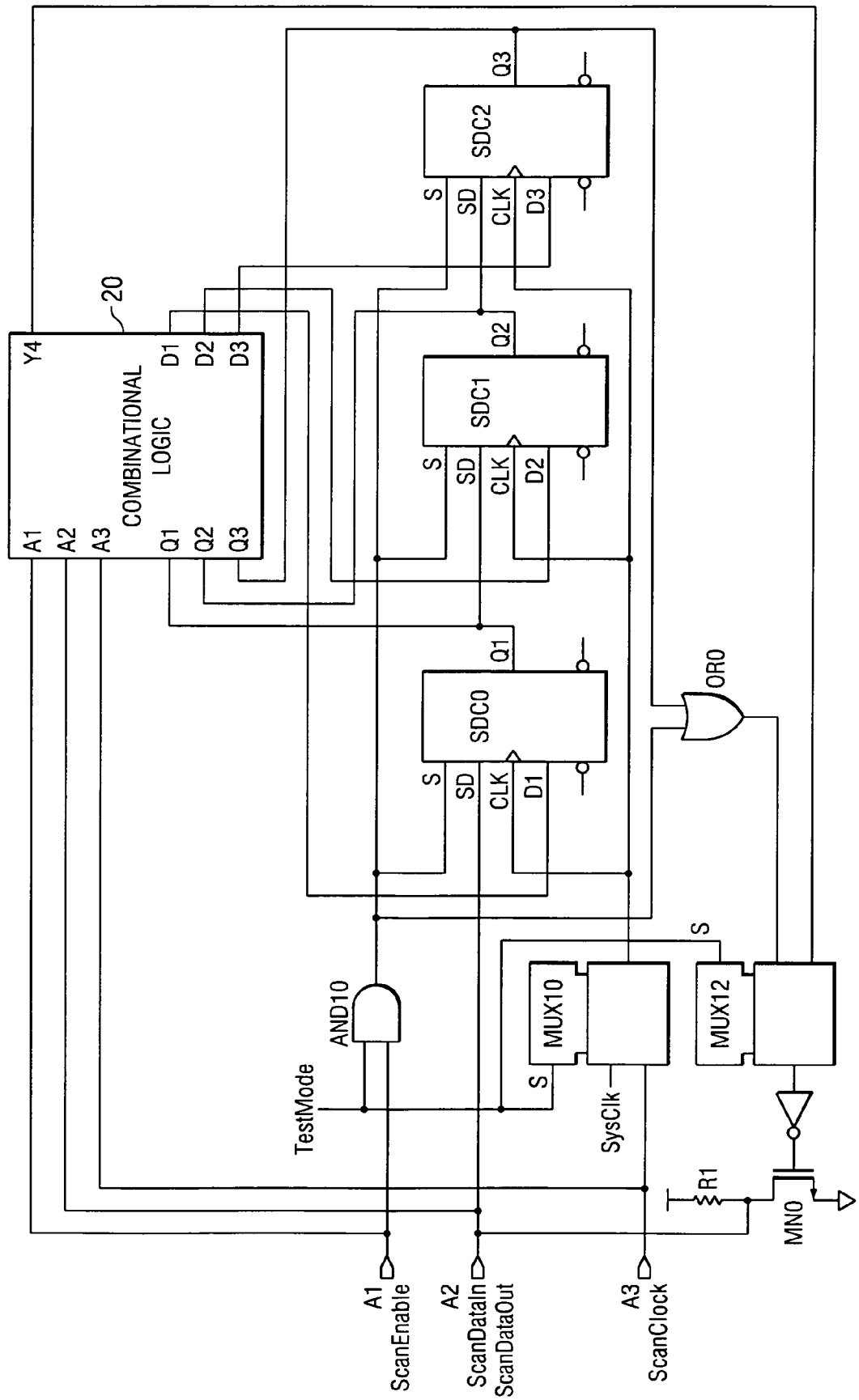
FIG. 5 is a circuit diagram of a third preferred embodiment scan chain implemented using three pins by combining signals ScanDataIn and ScanDataOut on one pin.

A third preferred embodiment reduced pin count scan chain implementation, shown in FIG. 5, is similar to the three pin scan chain, shown in FIG. 3, in that it combines signals ScanDataIn and ScanDataOut onto one pin A2. Instead of providing a weak driver and a strong driver, it has an open drain output device MN0 with a pull-up resistor R1. For an open drain with pull-up resistor, a logic 1 output is inherently weak and may be over-driven. To assure that the output is logic 1 when data in for the scan chain is required, signal ScanEnable is fed to OR gate OR0 along with the output of the shift register Q3 so that the output signal ScanDataOut is always 1 when signal ScanEnable is 1. To observe signal ScanDataOut, signal ScanEnable is set to logic 0 for a time (not during the active edge of signal ScanClock) to allow the output Q3 of the scan chain to appear on pin A2. To be able to use pin A2 as an input to the combinational logic 20 for signal ScanClockEdge when signal ScanEnable=0, the output of the last flip/flop SDC2 must be set to 1 immediately before this clock edge. (Adding an additional flip/flop to the end of the scan chain whose output is not used by the combinational logic 20 would eliminate the problem of not being able to control input Q3 to the combinational logic 20 to a logic 0.)

Figure 6:
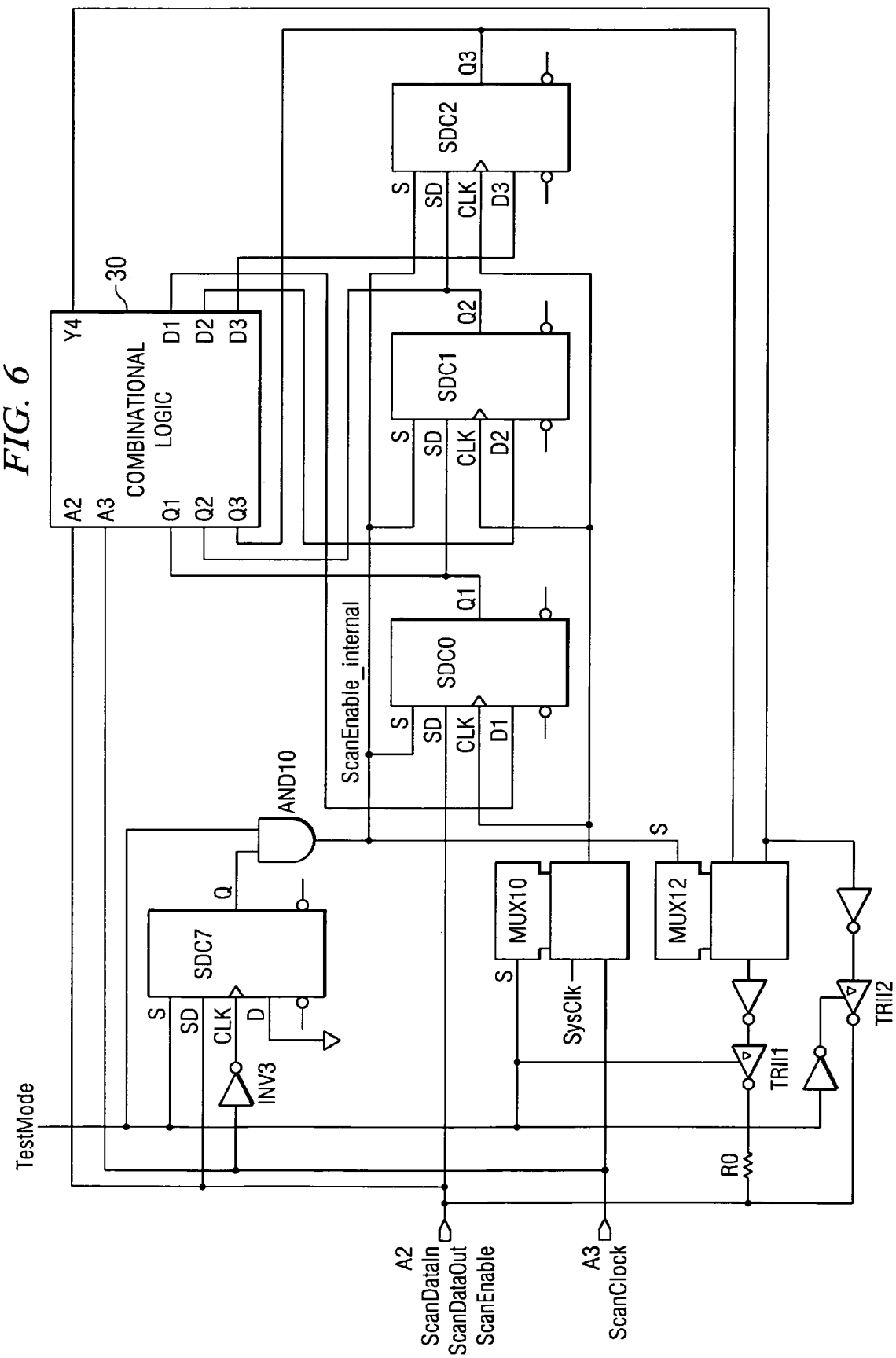
FIG. 6 is a circuit diagram of a fourth preferred embodiment scan chain implemented using two pins by combining the technique from the three pin scan chain shown in FIG. 3, and the technique from the three pin scan chain shown in FIG. 4, to combine signals ScanDataIn, ScanDataOut, and ScanEnable on one pin.

A fourth preferred embodiment reduced pin count scan chain implementation, shown FIG. 6, is a scan chain implemented using two pins by using the technique from the three pin scan chain shown in FIG. 3, and the technique from the three pin scan chain shown in FIG. 4, to combine signals ScanDataIn, ScanDataOut, and ScanEnable on one pin A2 and the other pin A3 provides signal ScanClock.

One of the advantages of these techniques is that it is very easy to utilize existing test generation tools which generate circuitry and patterns using signals ScanEnable, ScanDataIn, ScanDataOut, and ScanClock. The circuit design provided by the tools only requires the addition of a few gates to be used and the test patterns are also easily combined.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A synchronous logic device with reduced pin count scan chain comprising:
    more than two flip/flops coupled to form a shift register for receiving a scan data input signal and providing a test mode output;
    a combinational logic circuit for receiving device inputs, generating flip/flop inputs for the more than two flip/flops, and generating a normal mode output;
    wherein the scan data input signal and test mode output share an input/output pin;
    a multiplexer for selecting between the test mode output and the normal mode output, and for providing a scan data output signal to the input/output pin;
    a first output driver coupled between the multiplexer and the input/output pin; and
    a second output driver for coupling the normal mode output to the input/output pin.

2. The device of claim 1 further comprising a resistor coupled between the first output driver and the input/output pin.

3. The device of claim 1 further comprising an open drain output device coupled between the multiplexer and the input/output pin.

4. The device of claim 3 further comprising a pull-up device coupled to the open drain device.

5. The device of claim 4 wherein the pull-up device is a resistor.

6. The device of claim 1 further comprising a multiplexer for providing a clock signal to the shift register during a test mode.

7. The device of claim 1 further comprising a scan enable signal coupled to an input of the combinational logic circuit and sharing the input/output pin.

8. The device of claim 7 further comprising a scan enable flip/flop controlled by the input/output pin and a test mode signal, and for providing a scan enable control signal to the shift register.

9. The device of claim 8 further comprising an inverter coupled between a scan clock input node and the scan enable flip/flop.

* * * * *